United States Patent
Jung (10) Patent No.: US 10,879,208 B2
(45) Date of Patent: Dec. 29, 2020

(54) CHIP-ON-FILM AND METHOD OF MANUFACTURING THE SAME

(71) Applicant: SAMSUNG ELECTRONICS CO., LTD., Suwon-si (KR)

(72) Inventor: Jae Min Jung, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/533,440

(22) Filed: Aug. 6, 2019

(65) Prior Publication Data
US 2020/0243474 A1   Jul. 30, 2020

(30) Foreign Application Priority Data
Jan. 24, 2019   (KR) .................. 10-2019-0008996

(51) Int. Cl.
*H01L 23/00*    (2006.01)
*H01L 23/498*   (2006.01)
(Continued)

(52) U.S. Cl.
CPC ........ *H01L 24/32* (2013.01); *H01L 21/76801* (2013.01); *H01L 21/76865* (2013.01);
(Continued)

(58) Field of Classification Search
CPC ........... H01L 2224/26175; H01L 24/32; H01L 24/73; H01L 23/49838; H01L 2224/73202
See application file for complete search history.

(56) References Cited

U.S. PATENT DOCUMENTS 7,190,073 B2 *   3/2007   Kwon ............... H01L 23/49811
                                                          257/737
7,579,552 B2     8/2009   Samsung Electronics Co Ltd
(Continued)

FOREIGN PATENT DOCUMENTS

JP   2000-323530 A      11/2000
JP   2004281861 A  *   10/2004   ............. H01L 21/60
(Continued)

OTHER PUBLICATIONS

Machine translation, Ikuta, Japanese Pat. Pub. No. JP 2000-323530, translation date: Aug. 27, 2020, Espacenet, all pages. (Year: 2020).*
(Continued)

*Primary Examiner* — Victoria K. Hall
(74) *Attorney, Agent, or Firm* — Volentine, Whitt & Francos, PLLC (57) ABSTRACT

A chip-on-film includes an insulating film including a bonding region for bonding to an external device, a plurality of interconnections disposed on the insulating film and partially extending into the bonding region, and an integrated circuit (IC) chip disposed on the insulating film so as to be electrically connected to the plurality of interconnections. The chip-on-film further includes a solder resist disposed so as to cover the insulating film excluding the bonding region and so as to cover the plurality of interconnections excluding portions extending into the bonding region, and a stepped portion located between the bonding region and the solder resist. The stepped portion forms a boundary against a flow of the solder resist into the bonding region.

20 Claims, 7 Drawing Sheets

(51) Int. Cl.
  *H01L 21/00* (2006.01)
  *H01L 21/768* (2006.01)
  *H01L 21/02* (2006.01)
(52) U.S. Cl.
  CPC ........ *H01L 23/49838* (2013.01); *H01L 24/73* (2013.01); *H01L 21/02354* (2013.01); *H01L 2224/26175* (2013.01); *H01L 2224/73203* (2013.01)

(56) References Cited

U.S. PATENT DOCUMENTS

| | | | | |
|---|---|---|---|---|
| 7,649,246 | B2* | 1/2010 | Chung | H01L 23/4985 257/668 |
| 7,671,454 | B2 | 3/2010 | Sharp Kk | |
| 9,113,545 | B2* | 8/2015 | Han | H05K 1/028 |
| 9,572,248 | B2* | 2/2017 | Lee | H05K 3/284 |
| 2004/0070057 | A1* | 4/2004 | Yoshiike | H01L 21/563 257/676 |
| 2004/0262758 | A1* | 12/2004 | Hashimoto | H01L 24/14 257/750 |
| 2005/0218513 | A1* | 10/2005 | Seko | H01L 23/544 257/734 |
| 2005/0248521 | A1* | 11/2005 | Kimura | G02F 1/1345 345/96 |
| 2005/0285277 | A1* | 12/2005 | Kwon | H01L 21/563 257/778 |
| 2006/0071303 | A1 | 4/2006 | Samsung Electronics Co Ltd | |
| 2007/0057369 | A1* | 3/2007 | Imamura | H05K 3/242 257/737 |
| 2008/0111249 | A1* | 5/2008 | Miyazaki | H01L 21/563 257/778 |
| 2009/0273076 | A1* | 11/2009 | Choi | H01L 23/4985 257/702 |
| 2011/0044017 | A1* | 2/2011 | Ono | H01L 23/12 361/771 |
| 2013/0032939 | A1* | 2/2013 | Chen | H01L 23/552 257/737 |
| 2013/0175528 | A1* | 7/2013 | Han | H01L 23/4985 257/48 |
| 2014/0300849 | A1* | 10/2014 | Jung | H01L 23/4985 349/139 |
| 2016/0197020 | A1* | 7/2016 | Lim | H01L 23/49838 257/48 |
| 2016/0218065 | A1* | 7/2016 | Ha | H01L 23/4985 |
| 2017/0062370 | A1* | 3/2017 | Shiraki | H01L 23/49816 |
| 2017/0287814 | A1* | 10/2017 | Kim | H01L 23/29 |
| 2017/0358762 | A1* | 12/2017 | Min | H01L 51/5237 |
| 2018/0322848 | A1* | 11/2018 | Wu | G09G 5/00 |
| 2019/0051593 | A1* | 2/2019 | Kimura | G02F 1/13338 |

FOREIGN PATENT DOCUMENTS

| | | | | |
|---|---|---|---|---|
| JP | 2005310838 A | * | 11/2005 | ............ H01L 23/29 |
| KR | 1998-020497 A | | 6/1998 | |
| KR | 1020060133672 A | | 12/2006 | |

OTHER PUBLICATIONS

Machine translation, Kim, Korean Pat. Pub. No. KR 1998-0020497, translation date: Aug. 27, 2020, KIPO, all pages. (Year: 2020).*
Machine translation of Abstract, Myungcheon Kim, Korean Pat. Pub. No. KR 1998-0020497, translation date: Aug. 27, 2020, Espacenet, all pages. (Year: 2020).*
Machine translation, Kim, Korean Pat. Pub. No. KR 10-2006-0133672, translation date: Aug. 27, 2020, Espacenet, all pages. (Year: 2020).*
Machine translation, Nagao, Japanese Pat. Pub. No. JP 2005-310848, translation date: Aug. 27, 2020, Espacenet, all pages. (Year: 2020).*
Machine translation, Fujimaru, Japanese Pat. Pub. No. JP 2004-281861, translation date: Aug. 27, 2020, Espacenet, all pages. (Year: 2020).*

* cited by examiner

ETCHING INSULATING FILM AND INTERCONNECTION BY APPLYING LASER

CHIP-ON-FILM AND METHOD OF MANUFACTURING THE SAME

CROSS-REFERENCE TO RELATED APPLICATION

A claim of priority is made to Korean Patent Application No. 10-2019-0008996, filed Jan. 24, 2019, the disclosure of which is incorporated herein by reference in its entirety.

BACKGROUND

Apparatus and methods consistent with example embodiments relate to a chip-on-film (COF) and to a method of manufacturing the same.

In COF technology, a solder resist (SR) may be applied to metal interconnections formed on a polyimide (PI) surface in order to protect the metal interconnections. The SR is not to be applied, however, to a bonding region of the PI surface in which the COF is to be bonded to a printed circuit board (PCB) or a display panel. In the meantime, in the case where the COF is applied to a display panel, minimum tolerances of the bonding region are necessarily reduced as the width of a bezel surrounding the display is narrowed to comply with industry demands.

SUMMARY

According to example embodiments, a chip-on-film is provided which includes an insulating film including a bonding region for bonding to an external device, a plurality of interconnections disposed on the insulating film and partially extending into the bonding region, and an integrated circuit (IC) chip disposed on the insulating film so as to be electrically connected to the plurality of interconnections. The chip-on-film further includes a solder resist disposed so as to cover the insulating film excluding the bonding region and so as to cover the plurality of interconnections excluding portions extending into the bonding region, and a stepped portion located between the bonding region and the solder resist. The stepped portion forms a boundary against a flow of the solder resist into the bonding region.

According to example embodiments, a method of manufacturing a chip-on-film is provided which includes punching sprocket holes in an insulating film along an edge of the insulating film, the insulating film including a bonding region for bonding to an external device, and forming a plurality of interconnections on the insulating film so as to partially extend into the bonding region. The method further includes forming a solder resist so as to cover the insulating film excluding the bonding region, and so as to cover the plurality of interconnections excluding portions extending into the bonding region, forming a stepped portion by etching upper surfaces of the insulating film and the plurality of interconnections, the stepped portion located at a boundary between the solder resist and the bonding region, electrically connecting the plurality of interconnections to an integrated circuit (IC) chip through a plurality of electrode bumps, and molding a periphery of the IC chip.

According to example embodiments, a method of manufacturing a chip-on-film is provided which includes punching sprocket holes in an insulating film along an edge of the insulating film, the insulating film including a bonding region for bonding to an external device, and forming a plurality of interconnections on the insulating film so as to partially extend into the bonding region. The method further includes forming a stepped portion by etching upper surfaces of the insulating film and the plurality of interconnections at portions located at a boundary of the bonding region, forming a solder resist so as to cover the insulating film excluding the bonding region, and so as to cover the plurality of interconnections excluding portions extending into the bonding region, electrically connecting the plurality of interconnections to an integrated circuit (IC) chip through a plurality of electrode bumps, and molding a periphery of the IC chip.

DETAILED DESCRIPTION OF EXEMPLARY EMBODIMENTS

Hereinafter, a chip-on-film (COF) and a method of manufacturing the same according to example embodiments of the inventive concept will be described with reference to the accompanying drawings.

Figure 1:
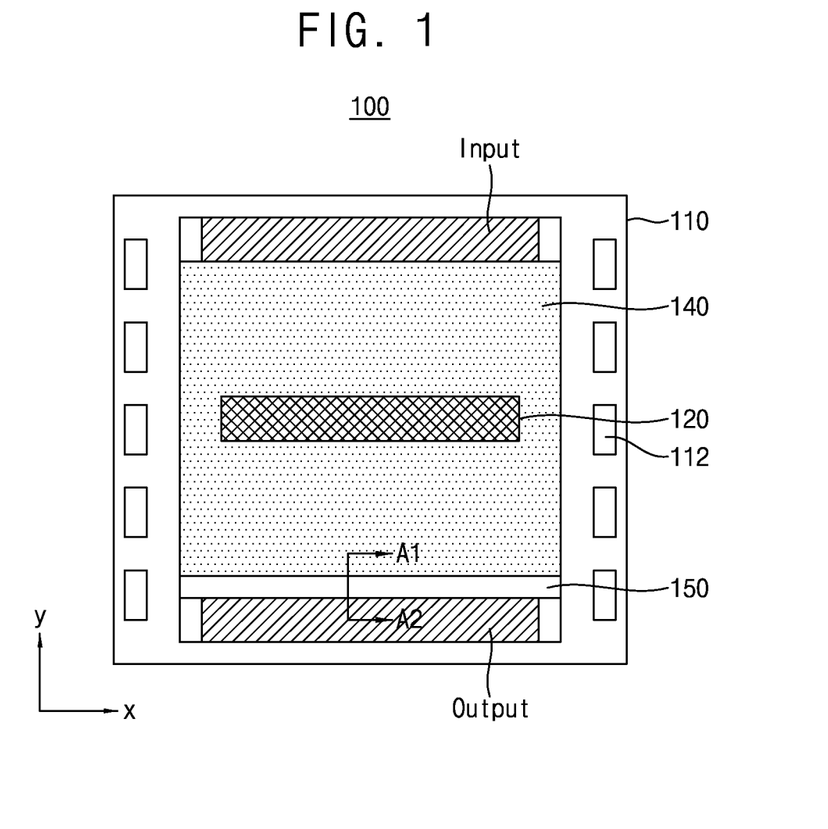
FIG. 1 is a plan view of a chip-on-film (COF) according to an example embodiment of the inventive concept.
Figure 2:
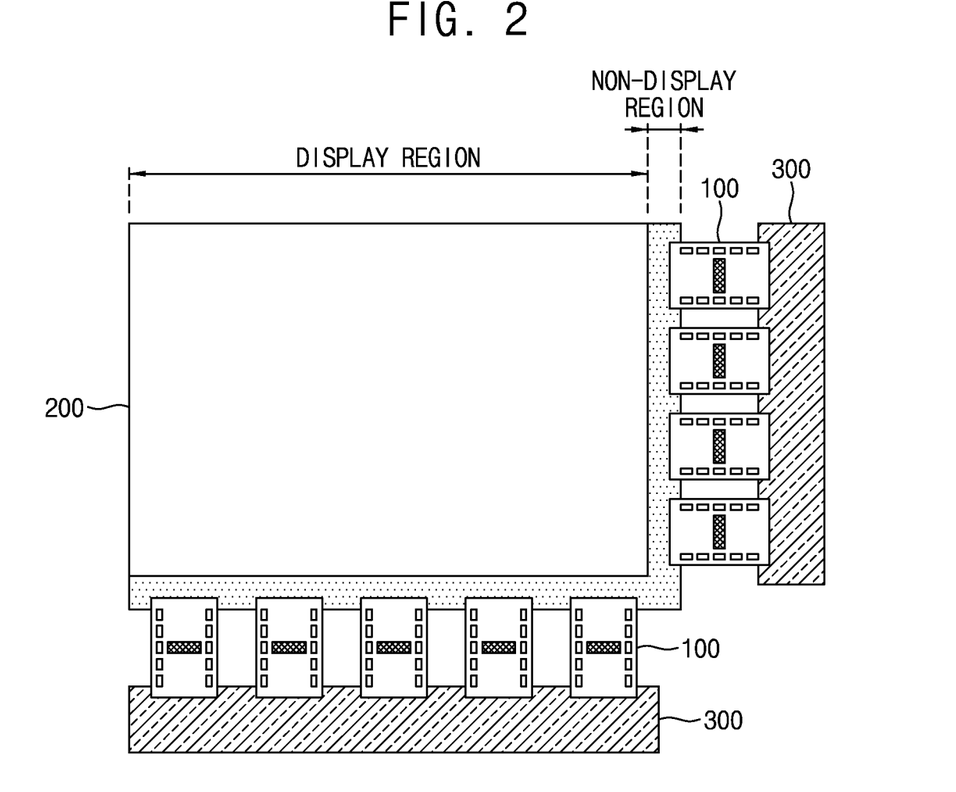
FIG. 2 is a plan view showing an example in which the COF according to the example embodiment of the inventive concept is bonded to a display panel.
Figure 3:
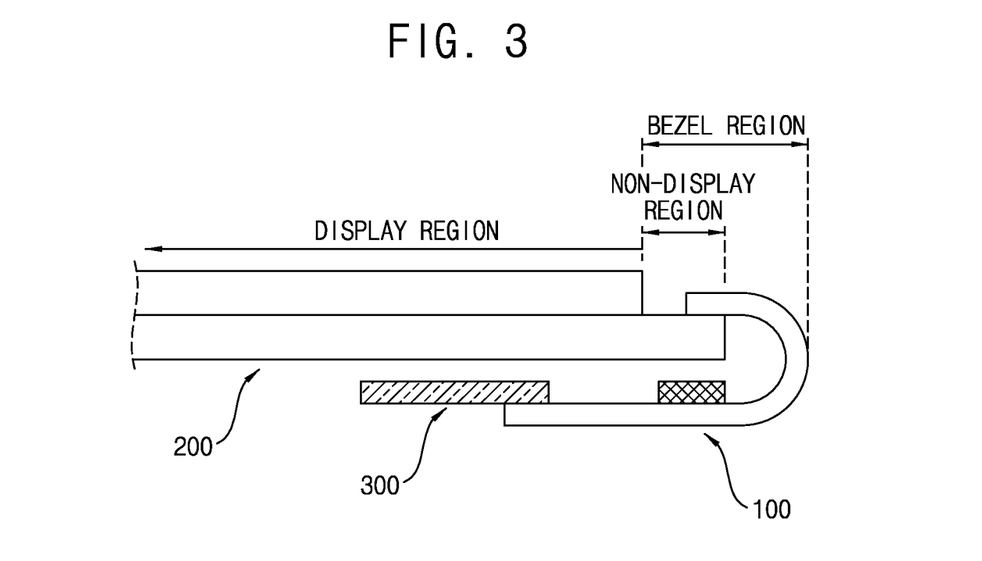
FIG. 3 is a cross-sectional view showing an example in which the COF according to the example embodiment of the inventive concept is bonded to the display panel.

FIG. 1 is a plan view of a COF according to an example embodiment of the inventive concept. FIGS. 2 and 3 are a plan view and a cross-sectional view, respectively, showing an example in which the COF according to the example embodiment of the inventive concept is bonded to a display panel. For purposes of explanation, the COF when laid flat is shown as lying in an x-y plane, where x and y are directions orthogonal to each other and orthogonal to a z direction.

Referring collectively to FIGS. 1 to 3, a COF 100 of the inventive concept may include an insulating film 110 (e.g., polyimide (PI)), an integrated circuit (IC) chip 120, a plurality of interconnections 130 (shown in FIG. 4), a solder resist 140, and a stepped portion 150.

The insulating film 110 is a base film and the plurality of interconnections 130, that is, an interconnection pattern, may be disposed on the insulating film 110. Further, the IC chip 120 electrically connected to the interconnection pattern may be disposed on the insulating film 110. That is, for example, the plurality of interconnections 130 may be electrically connected to the IC chip 120 through a plurality of electrode bumps (not shown). The interconnections 130 may be formed of an electrically conductive metal, for example, copper (Cu). The IC chip 120 may be disposed at a central portion of the insulating film 110. Sprocket holes 112, which are provided for alignment purposes in an exposure process, are formed adjacent opposite edges of the insulating film 110. In this example, the opposite edges of the insulating film 110 extend in the y-direction.

The solder resist 140 may be applied to cover a surface portion of the insulating film 110 and interconnections 130 excluding a region in which a display panel 200 and the interconnections 130 are bonded. The solder resist 140 may be disposed to cover portions of the insulating film 110 and the interconnections 130 in order to protect the insulating film 110 and the interconnections 130. For example, the solder resist 140 may be disposed to cover the insulating film 110 and the interconnections 130 in a region excluding the bonding region.

Output ends of the interconnections 130 may be exposed to the outside of the solder resist 140. The exposed portions of the output ends of the interconnections 130 may be bonded to a non-display region of the display panel 200. Input ends of the interconnections 130 may be exposed to the outside of the solder resist 140. The exposed portions of the input ends of the interconnections 130 may be bonded to a printed circuit board (PCB) 300.

Figure 4:
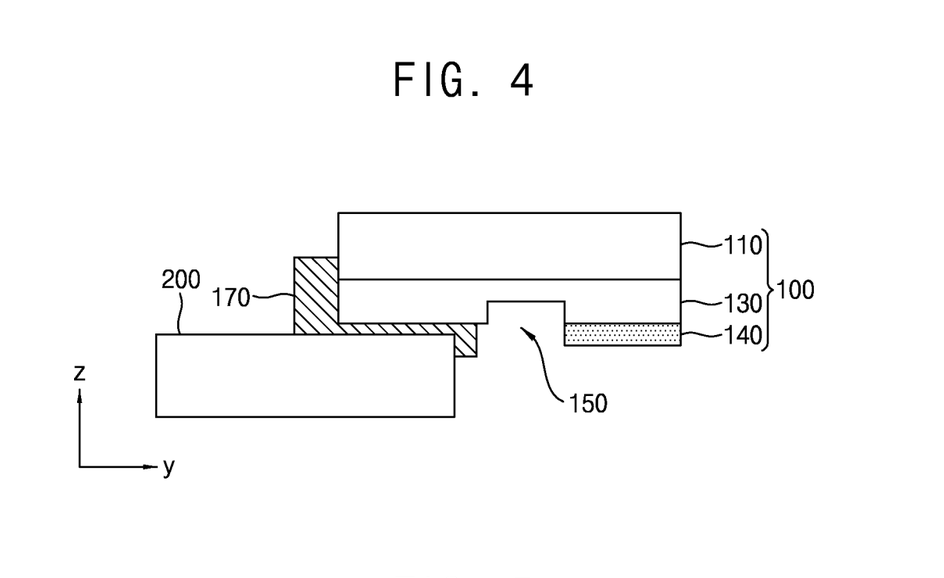
FIG. 4 is a view showing portions of the display panel and the COF that are bonded together.

FIG. 4 is a view showing portions of the display panel and the COF that are bonded together.

Referring to FIG. 4, the output ends of the interconnections 130 are exposed to the outside of the solder resist 140. An anisotropic conductive film (ACF) 170 may be disposed on the exposed portions of the output ends of the plurality of interconnections 130.

The COF 100 of the inventive concept may be bent (see FIG. 3) so as to be disposed opposite to a surface on which an image is displayed after being bonded to the display panel 200. An input end of the COF 100 and the PCB 300 may be electrically connected and the PCB 300 may be disposed to overlap the display panel 200.

Figure 5:
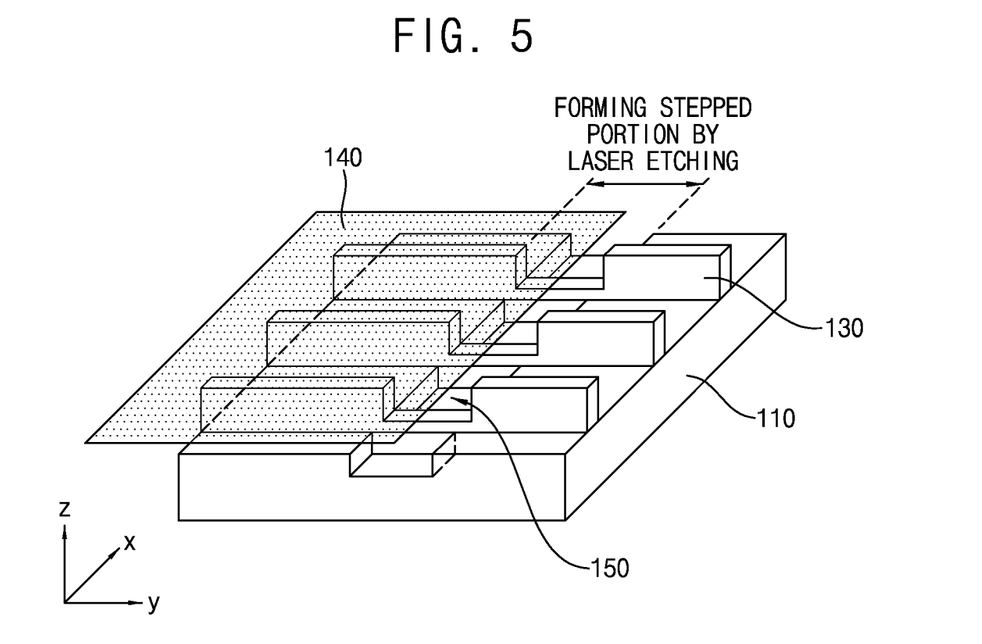
FIG. 5 is a view showing a stepped portion formed in the COF.
Figure 6:
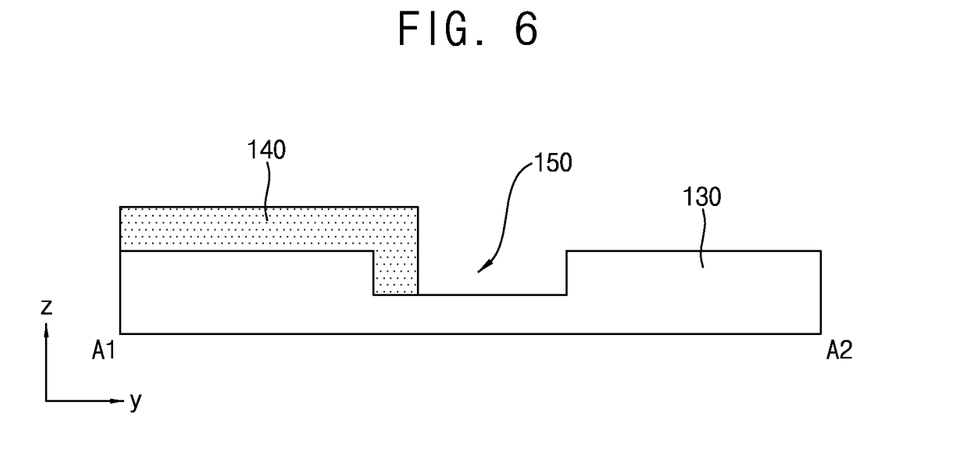
FIG. 6 is a cross-sectional view taken along line A1-A2 of FIG. 1.

FIG. 5 is a view showing the stepped portion formed in the COF. FIG. 6 is a cross-sectional view taken along line A1-A2 of FIG. 1.

Referring to FIGS. 1, 5, and 6, the stepped portion 150 may be formed on a rear surface of the COF 100. That is, the stepped portion 150 may be formed on a surface on which the interconnection pattern of the COF is disposed. The stepped portion 150 may be formed at a boundary portion between the solder resist 140 and the bonding region. The stepped portion 150 may be formed to have a predetermined width (e.g., a width of 25 μm to 75 μm in the y-direction) by etching the insulating film 110 and the plurality of interconnections 130 using a laser etching process. The insulating film 110 may be etched from an upper surface thereof by a predetermined thickness by performing a laser etching process at the boundary portion between the solder resist 140 and the bonding region. Further, the stepped portion 150 may be formed in the form of a trench (or a dam) by etching the plurality of interconnections 130 from upper surfaces thereof by a predetermined thickness.

In the example of FIGS. 5 and 6, the stepped portion 150 includes "steps" in both the x-direction and the y-direction. That is, in the x-direction, trenches formed in the insulating film 110 step up to and down from trenches formed in the interconnections 130. In the y-direction, a principal surface of the insulating film 110 steps down to and up from a surface of the trenches formed in the insulating film 110, and a principal surface of the interconnections 130 steps down to and up from surfaces of respective trenches formed in the interconnections 130.

The stepped portion 150 has been described as being disposed at the boundary portion between the solder resist 140 and the bonding region. The inventive concept is not limited thereto, and the boundary portion of the bonding region may be defined by forming the stepped portion 150 at an end on which the solder resist 140 is formed. That is, the boundary portion between the solder resist 140 and the bonding region may be defined by the stepped portion 150.

For example, in the manufacturing process, when the stepped portion 150 is formed after the solder resist 140 is applied, the solder resist 140 is not present on the insulating film 110 and the interconnections 130 of the stepped portion 150. That is, when the stepped portion 150 is formed using a laser etching process, the solder resist 140 is removed while the insulating film 110 and the interconnections 130 are etched so that the solder resist 140 is not formed on the stepped portion 150.

For example, in the manufacturing process, when the solder resist 140 is applied after the stepped portion 150 is formed, a portion of the solder resist 140 may remain on the insulating film 110 and the interconnections 130 of the stepped portion 150. When the solder resist 140 is formed after the stepped portion 150 is formed, a trench (or a dam) may be formed by the stepped portion 150 so that the solder resist 140 may be prevented from entering the bonding region.

Figure 7:
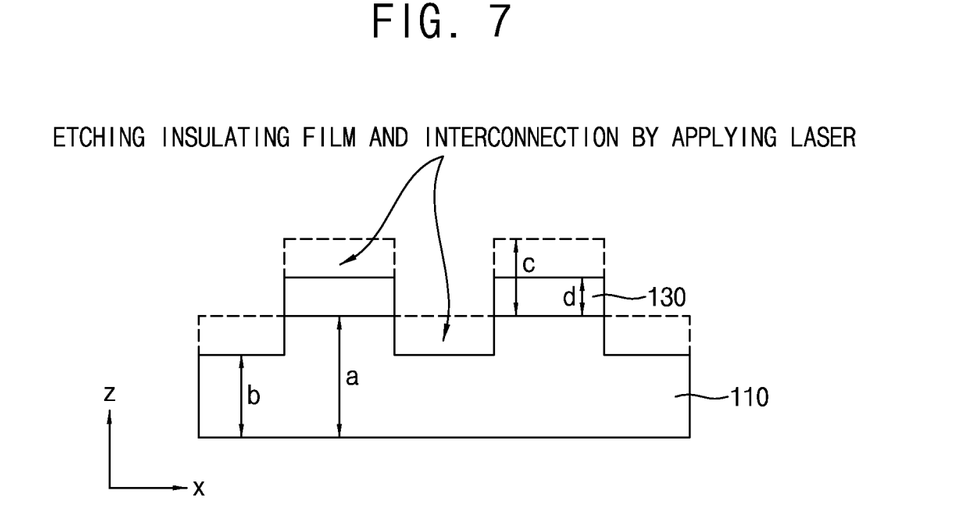
FIG. 7 is a view representing a reduction in thicknesses of an interconnection and a base film (PI) when a stepped portion is formed.

FIG. 7 is a view showing a state in which thicknesses of an interconnection and a base film (PI) are reduced when a stepped portion is formed.

Referring to FIG. 7, a portion of the insulating film 110 excluding the stepped portion 150 may have a thickness "a" in the z-direction. A portion of the insulating film 110 corresponding to the stepped portion 150 may have a thickness "b" in the z-direction that is less than the thickness "a". Portions of the interconnections 130 excluding the stepped portion 150 may have a thickness "c" in the z-direction. Portions of the interconnections 130 corresponding to the stepped portion 150 may have thickness "d" in the z-direction that is less than the thickness "c".

The stepped portion 150 may be formed by etching the insulating film 110 by 10% to 50% of a total thickness thereof. Further, the stepped portion 150 may be formed by etching the interconnections 130 by 20% to 90% of a total thickness thereof. That is, in a portion in which the stepped portion 150 is formed, the insulating film 110 has a thickness of 50% to 90% of other portions of the insulating film 110. In the portion in which the stepped portion 150 is formed, the interconnections 130 have a thickness of 10% to 80% of the other portions of the interconnections 130. As described above, the insulating film 110 and the interconnections 130 may be formed to have a reduced thickness in the stepped portion 150 to form a trench (or a dam) having a predetermined width.

Figure 8:
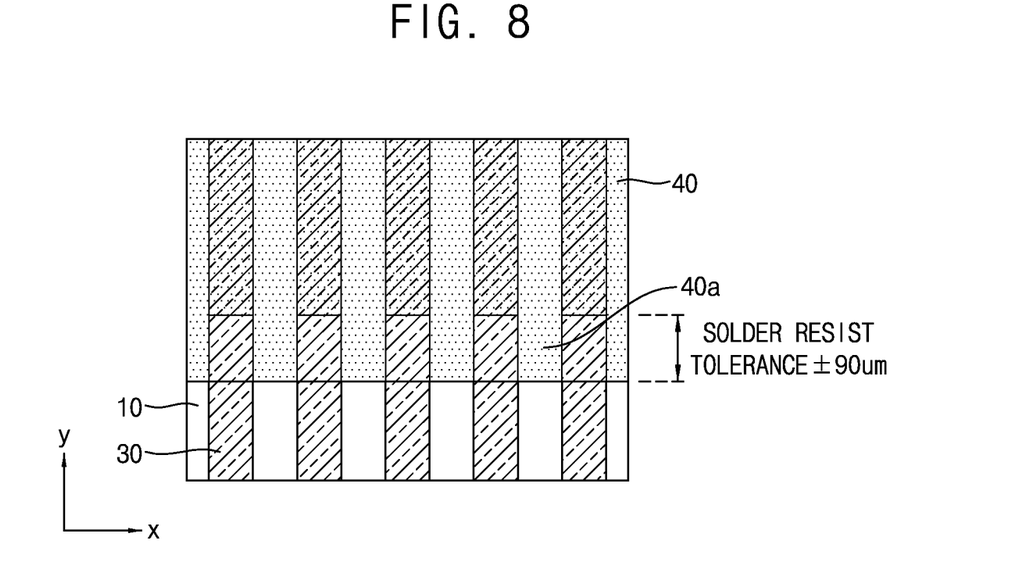
FIG. 8 is a view showing a state in which a solder resist, which is applied to protect an interconnection pattern of a COF, flows down into a bonding region of an output end such that a failure occurs.

FIG. 8 is a view showing a state in which a solder resist, which is applied to protect an interconnection pattern of a COF, flows down into a bonding region of an output end such that a failure occurs.

Referring to FIG. 8, when a COF is manufactured generally, a solder resist 40 is applied by a screen mask printing method in order to protect a plurality of interconnections 30 disposed on a surface of an insulating film 10. When a paste of the solder resist 40 is supplied onto a screen mask, a squeegee is moved to squeeze a protective region of a pattern of the interconnections 30.

A region which is bonded to a display panel is left as a region in which the solder resist 40 is not applied. As described above, the solder resist 40 should not be applied to a bonding region of the COF. However, the paste of the solder resist 40 flows down into a bonding region 40a so that the solder resist 40 enters the bonding region.

As semiconductor devices are becoming highly integrated, a density of an interconnection pattern of a COF is increased and a solder resist 40 is unevenly formed in a bonding region, and thus a bonding failure of the display panel and the COF may occur. In order to reduce the number of bonding failures, a tolerance of ±90 μm should be ensured to avoid the solder resist 40 from flowing down into the bonding region. When the COF is applied to a display device, this tolerance disadvantageously increases the width of a bezel of a display device.

Figure 9:
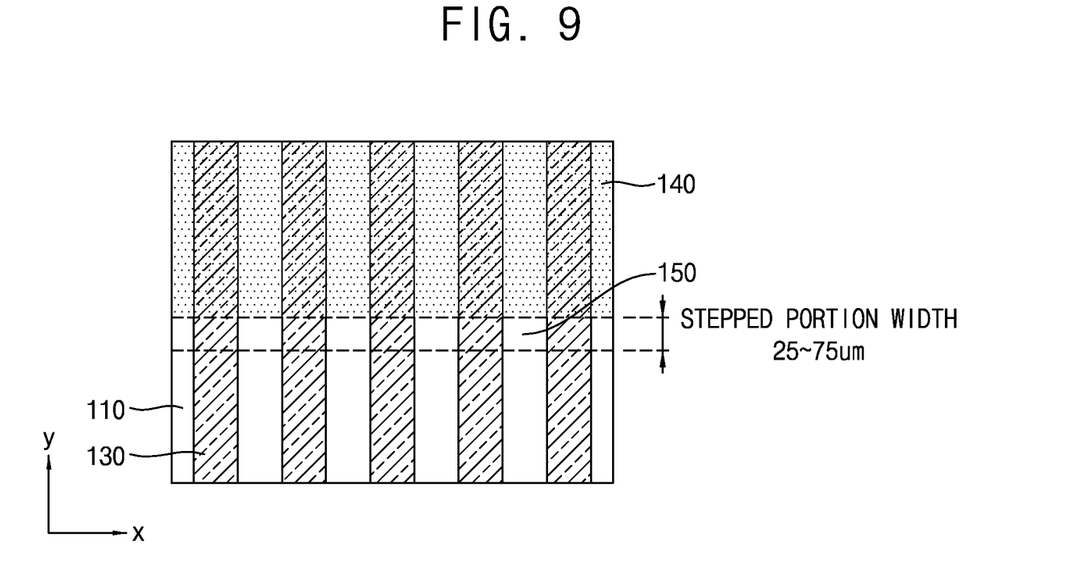
FIG. 9 is a view showing a state in which a stepped portion is formed at an output end so that an applied solder resist is prevented from flowing down into a bonding region.

FIG. 9 is a view showing a state in which a stepped portion is formed at an output end so that a solder resist to be applied is prevented from flowing down.

Referring to FIG. 9, the COF 100 of the inventive concept includes a stepped portion 150 having a predetermined depth (e.g., a depth of 10% to 50% of a total thickness of the insulating film or a depth of 20% to 90% of a total thickness of the interconnection) and a predetermined width (e.g., a width of 25 μm to 75 μm) at the boundary portion between the solder resist 140 and the bonding region.

The stepped portion 150 may be formed in the form of a straight line at the boundary portion between the solder resist 140 and the bonding region. The stepped portion 150 may be formed in the form of a straight line so as to cross the plurality of interconnections 130. The stepped portion 150 may be formed at the boundary portion between the solder resist 140 and the bonding region so that the solder resist 140 may be prevented from entering the bonding region.

For example, in the manufacturing process, the stepped portion 150 is formed first in consideration of the width of the bonding region, and the solder resist 140 may be applied after the stepped portion 150 is formed. A trench (or a dam) is formed on an interface between the bonding region and the solder resist 140 due to the stepped portion 150. Accordingly, it is possible to prevent the paste of the solder resist 140 from flowing into the bonding region and thereby prevent the solder resist 140 from entering the bonding region.

For example, in the manufacturing process, after the solder resist 140 is applied, the stepped portion 150 may be formed at the boundary portion between the solder resist 140 and the bonding region. In the manufacturing process, even when a portion of the solder resist 140 enters the bonding region, the solder resist 140 which has entered the bonding region is removed when the stepped portion 150 is formed so that the solder resist 140 may be prevented from entering the bonding region.

Figure 10:
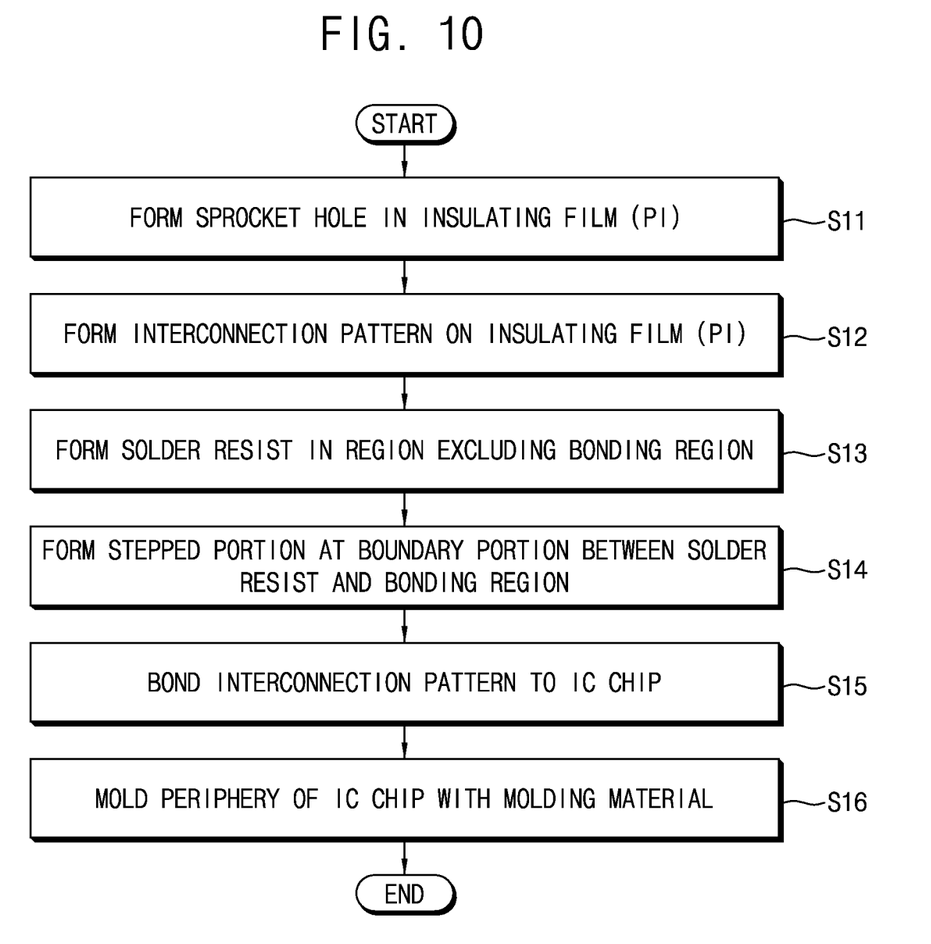
FIG. 10 is a flowchart for reference in describing a method of manufacturing a COF according to an example embodiment of the inventive concept.

FIG. 10 is a flowchart for reference in describing a method of manufacturing a COF according to an example embodiment of the inventive concept.

Referring to FIGS. 1, 5, and 10, sprocket holes 112, which are functional holes for aligning in an exposure process, may be formed at an edge of an insulating film 110 by performing a punching process (S11).

Next, an interconnection pattern may be formed on the insulating film 110 (S12).

The interconnection pattern may include a plurality of interconnections 130 and the plurality of interconnections 130 may be formed of a metal (e.g., copper (Cu)) having a high conductivity.

Next, a solder resist 140 may be formed by applying a paste to cover the insulating film 110 and the plurality of interconnections 130 (S13).

For example, the solder resist 140 may be disposed to cover portions of the insulating film 110 and the plurality of interconnections 130 in order to protect the insulating film 110 and the plurality of interconnections 130. The solder resist 140 may be formed on a portion excluding a bonding region in which a display panel 200 and a COF 100 are to be bonded. That is, the solder resist 140 may be disposed to cover the insulating film 110 and the plurality of interconnections 130 in the region excluding the bonding region.

Output ends of the plurality of interconnections 130 may be exposed to the outside of the solder resist 140. In a subsequent manufacturing process, the exposed portions of the output ends of the plurality of interconnections 130 may be bonded to a non-display region of the display panel 200. Input ends of the plurality of interconnections 130 may be exposed to the outside of the solder resist 140. In the subsequent manufacturing process, the exposed portions of the input ends of the plurality of interconnections 130 may be bonded to a PCB 300.

Next, a stepped portion 150 may be formed at a boundary portion between the solder resist 140 and the bonding region (S14).

For example, the stepped portion 150 may be formed to have a predetermined width (e.g., a width of 25 μm to 75 μm) by etching the insulating film 110 and the plurality of interconnections 130 using a laser etching process. The insulating film 110 may be etched from an upper surface thereof by a predetermined thickness by performing a laser etching process. That is, a thickness of the insulating film 110 may be reduced by performing the laser etching process. Further, the stepped portion 150 may be formed in the form of a trench (or a dam) by etching the plurality of interconnections 130 from upper surfaces thereof by a predetermined thickness. That is, thicknesses of the plurality of interconnections 130 may be reduced by performing the laser etching process.

As shown in FIG. 7, the stepped portion 150 may be formed by etching the insulating film 110 by 10% to 50% of the total thickness thereof and etching the plurality of interconnections 130 by 20% to 90% of the total thickness thereof. That is, in a portion in which the stepped portion 150 is formed, the insulating film 110 may have a thickness of 50% to 90% of the other portions. In the portion in which the stepped portion 150 is formed, the plurality of interconnections 130 may have a thickness of 10% to 80% of the other portions. As described above, the stepped portion 150 is formed by etching the insulating film 110 and the plurality of interconnections 130 such that the thicknesses of the insulating film 110 and the plurality of interconnections 130 are reduced, and a trench (or a dam) having a predetermined width may be formed by the stepped portion 150.

Next, the interconnection pattern and an IC chip 120 may be bonded (S15).

The plurality of interconnections 130 may be electrically connected to the IC chip 120 through a plurality of electrode bumps. The IC chip 120 may be disposed at a central portion of the insulating film 110.

Next, a periphery of the IC chip 120 may be molded with a molding material (S16).

A liquid potting material having a constant viscosity containing a non-conductive paste (NCP), an epoxy resin, or curing agent may be used as the molding material.

Figure 11:
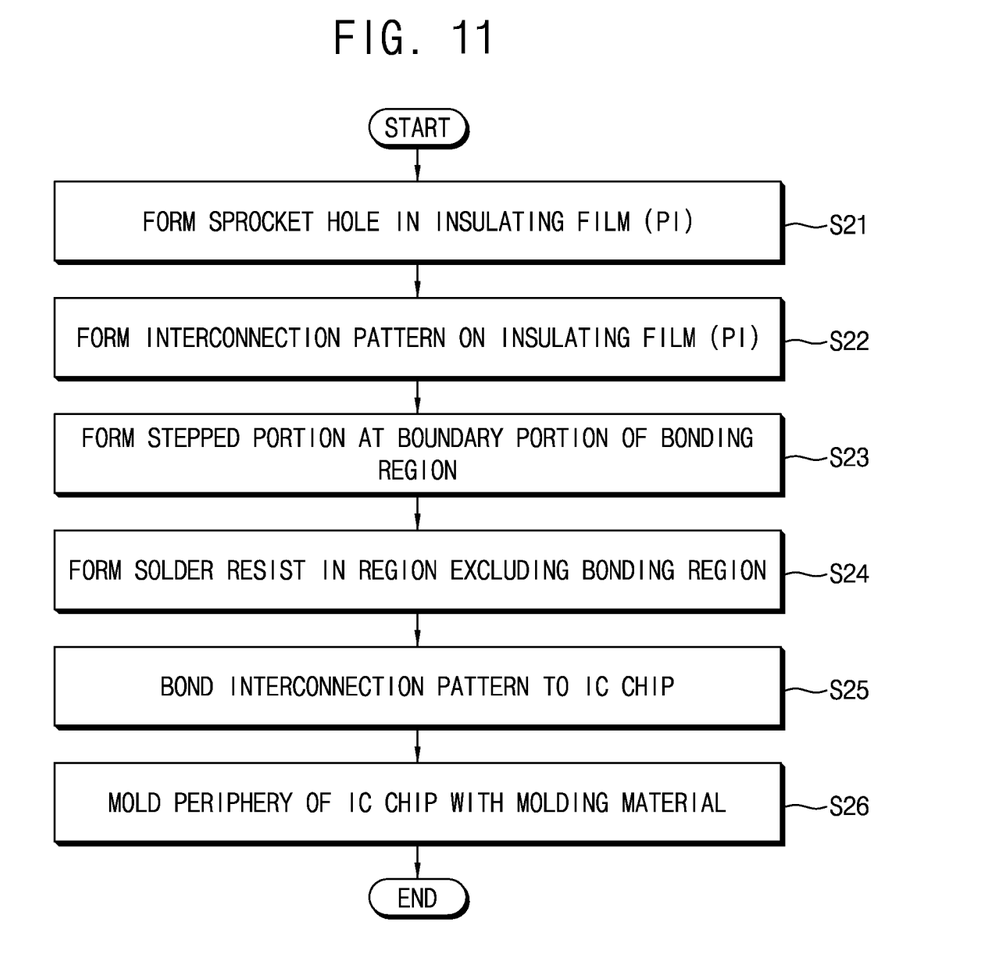
FIG. 11 is a flowchart for reference in describing a method of manufacturing a COF according to another example embodiment of the inventive concept.

FIG. 11 is a flowchart for reference in describing a method of manufacturing a COF according to an example embodiment of the inventive concept.

Referring to FIGS. 1, 5, and 11, sprocket holes 112, which are functional holes for aligning in an exposure process, may be formed at an edge of an insulating film 110 by performing a punching process (S21).

Next, an interconnection pattern may be formed on the insulating film 110 (S22).

The interconnection pattern may include a plurality of interconnections 130 and the plurality of interconnections 130 may be formed of a metal (e.g., copper (Cu)) having a high conductivity.

Next, a stepped portion 150 may be formed at a boundary portion of a bonding region (S23).

For example, the stepped portion 150 may be formed to have a predetermined width (e.g., a width of 25 μm to 75 μm) by etching the insulating film 110 and the plurality of interconnections 130 using a laser etching process. The insulating film 110 may be etched from an upper surface thereof by a predetermined thickness by performing a laser etching process. That is, a thickness of the insulating film 110 may be reduced by performing the laser etching process. Further, the stepped portion 150 may be formed in the form of a trench (or a dam) by etching the plurality of interconnections 130 from upper surfaces thereof by a predetermined thickness. That is, thicknesses of the plurality of interconnections 130 may be reduced by performing the laser etching process.

As shown in FIG. 7 described previously, the stepped portion 150 may be formed by etching the insulating film 110 by 10% to 50% of the total thickness thereof and etching the plurality of interconnections 130 by 20% to 90% of the total thickness thereof. That is, in a portion in which the stepped portion 150 is formed, the insulating film 110 may have a thickness of 50% to 90% of the other portions. In the portion in which the stepped portion 150 is formed, the plurality of interconnections 130 may have a thickness of 10% to 80% of the other portions. As described above, the stepped portion 150 is formed by etching the insulating film 110 and the plurality of interconnections 130 such that the thicknesses of the insulating film 110 and the plurality of interconnections 130 are reduced, and a trench (or a dam) having a predetermined width may be formed by the stepped portion 150.

Next, a solder resist 140 may be formed by applying a paste to cover the insulating film 110 and the plurality of interconnections 130 (S24).

For example, the solder resist 140 may be disposed to cover portions of the insulating film 110 and the plurality of interconnections 130 in order to protect the insulating film 110 and the plurality of interconnections 130. The solder resist 140 may be formed on a portion excluding the bonding region in which the display panel 200 and the COF 100 are bonded. That is, the solder resist 140 may be disposed to cover the insulating film 110 and the plurality of interconnections 130 in the region excluding the bonding region.

Output ends of the plurality of interconnections 130 may be exposed to the outside of the solder resist 140. In the subsequent manufacturing process, the exposed portions of the output ends of the plurality of interconnections 130 may be bonded to a non-display region of a display panel 200. Input ends of the plurality of interconnections 130 may be exposed to the outside of the solder resist 140. In the subsequent manufacturing process, the exposed portions of the input ends of the plurality of interconnections 130 may be bonded to a PCB 300.

Next, the interconnection pattern and an IC chip 120 may be bonded (S25).

The plurality of interconnections 130 may be electrically connected to the IC chip 120 through a plurality of electrode bumps. The IC chip 120 may be disposed at a central portion of the insulating film 110.

Next, a periphery of the IC chip 120 may be molded with a molding material (S26).

A liquid potting material having a constant viscosity containing an NCP, an epoxy resin, or curing agent may be used as the molding material.

According to the example embodiments of the inventive concept, a stepped portion may be formed, for example in the form of an elongate trench, at a boundary between a solder resist and a bonding region to inhibit the flow of solder resist into the bonding region. As such, a width tolerance of the bonding region of the COF can be reduced. Accordingly, a width of a bezel of a display device can be reduced.

While the embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation.

What is claimed is:

1. A chip-on-film comprising:
an insulating film including a bonding region for bonding to an external device;
a plurality of interconnections disposed on the insulating film and partially extending into the bonding region;
an integrated circuit (IC) chip disposed on the insulating film so as to be electrically connected to the plurality of interconnections;
a solder resist disposed so as to cover the insulating film excluding the bonding region and so as to cover the plurality of interconnections excluding portions extending into the bonding region; and
a stepped portion located between the bonding region and the solder resist, the stepped portion forming a boundary against a flow of the solder resist into the bonding region.

2. The chip-on-film of claim 1, wherein the stepped portion is a trench located in surfaces of the insulating film and the plurality of interconnections.

3. The chip-on-film of claim 2, wherein a portion of the insulating film excluding the trench has a first thickness and a portion of the insulating film at the trench has a second thickness which is less than the first thickness.

4. The chip-on-film of claim 3, wherein the second thickness is 10% to 50% less than the first thickness.

5. The chip-on-film of claim 2, wherein a portion of each of the plurality of interconnections excluding the stepped portion has a first thickness and a portion of each of the plurality of interconnections corresponding to the stepped portion has a second thickness that is less than the first thickness.

6. The chip-on-film of claim 5, wherein the second thickness is 20% to 90% less than the first thickness.

7. The chip-on-film of claim 1, wherein the stepped portion extends in a straight line so as to cross the plurality of interconnections.

8. The chip-on-film of claim 1, wherein the stepped portion has a width of 25 µm to 75 µm.

9. The chip-on-film of claim 1, wherein the bonding region is located at an output end of the chip-on-film.

10. The chip-on-film of claim 1, wherein the solder resist is not present in the stepped portion.

11. A method of manufacturing a chip-on-film, the method comprising:
- punching sprocket holes in an insulating film along an edge of the insulating film, the insulating film including a bonding region for bonding to an external device;
- forming a plurality of interconnections on the insulating film so as to partially extend into the bonding region;
- forming a solder resist so as to cover the insulating film excluding the bonding region, and so as to cover the plurality of interconnections excluding portions extending into the bonding region;
- forming a stepped portion by etching upper surfaces of the insulating film and the plurality of interconnections, the stepped portion located at a boundary between the solder resist and the bonding region;
- electrically connecting the plurality of interconnections to an integrated circuit (IC) chip through a plurality of electrode bumps; and
- molding a periphery of the IC chip.

12. The method of claim 11, wherein, when the stepped portion is formed, thicknesses of the insulating film and the plurality of interconnections are reduced by etching the upper surfaces of the insulating film and the plurality of interconnections with a laser.

13. The method of claim 12, wherein, when the stepped portion is formed, 10% to 50% of a total thickness of the insulating film is etched.

14. The method of claim 12, wherein, when the stepped portion is formed, 20% to 90% of a total thickness of the plurality of interconnections is etched.

15. The method of claim 12, wherein the stepped portion is formed to have a width of 25 µm to 75 µm.

16. A method of manufacturing a chip-on-film, the method comprising:
- punching sprocket holes in an insulating film along an edge of the insulating film, the insulating film including a bonding region for bonding to an external device;
- forming a plurality of interconnections on the insulating film so as to partially extend into the bonding region;
- forming a stepped portion by etching upper surfaces of the insulating film and the plurality of interconnections at portions located at a boundary of the bonding region;
- forming a solder resist so as to cover the insulating film excluding the bonding region, and so as to cover the plurality of interconnections excluding portions extending into the bonding region;
- electrically connecting the plurality of interconnections to an integrated circuit (IC) chip through a plurality of electrode bumps; and
- molding a periphery of the IC chip.

17. The method of claim 16, wherein, when the stepped portion is formed, thicknesses of the insulating film and the plurality of interconnections are reduced by etching the upper surfaces of the insulating film and the plurality of interconnections with a laser.

18. The method of claim 17, wherein, when the stepped portion is formed, 10% to 50% of a total thickness of the insulating film is etched.

19. The method of claim 17, wherein, when the stepped portion is formed, 20% to 90% of a total thickness of the plurality of interconnections is etched.

20. The method of claim 17, wherein the stepped portion is formed to have a width of 25 µm to 75 µm.

* * * * *